United States Patent
Engl et al.

(10) Patent No.: US 8,916,886 B2
(45) Date of Patent: Dec. 23, 2014

(54) OPTOELECTRONIC SEMICONDUCTOR COMPONENT

(75) Inventors: Moritz Engl, Regensburg (DE); Jörg Erich Sorg, Regensburg (DE); Thomas Zeiler, Nittendorf (DE); Joachim Reill, Zeitlarn (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 373 days.

(21) Appl. No.: 13/146,124

(22) PCT Filed: Dec. 23, 2009

(86) PCT No.: PCT/EP2009/067888
§ 371 (c)(1),
(2), (4) Date: Mar. 12, 2012

(87) PCT Pub. No.: WO2010/083929
PCT Pub. Date: Jul. 29, 2010

(65) Prior Publication Data
US 2012/0161162 A1  Jun. 28, 2012

(30) Foreign Application Priority Data
Jan. 23, 2009  (DE) .......................... 10 2009 005 907

(51) Int. Cl.
*H01L 33/50* (2010.01)
*H01L 33/58* (2010.01)
*H01L 25/075* (2006.01)

(52) U.S. Cl.
CPC ..... *H01L 25/0753* (2013.01); *H01L 2933/0091* (2013.01); *H01L 33/50* (2013.01); *H01L 33/58* (2013.01)
USPC .................. 257/88; 257/98; 257/80; 257/100; 438/27; 438/29; 438/26

(58) Field of Classification Search
CPC ....... H01L 33/58; H01L 33/50; H01L 25/075; H01L 25/0753; H01L 2933/0091
USPC ............. 257/88, E33.061, E33.074, E25.019; 438/27
See application file for complete search history.

(56) References Cited

U.S. PATENT DOCUMENTS

| 3,875,456 A | 4/1975 | Kano et al. |
| 6,271,631 B1 | 8/2001 | Burrows |
| 2005/0201109 A1 | 9/2005 | Shimura |

(Continued)

FOREIGN PATENT DOCUMENTS

| CN | 1667313 | 9/2005 |
| CN | 1841798 | 10/2006 |

(Continued)

*Primary Examiner* — Asok K Sarkar
*Assistant Examiner* — Dmitriy Yemelyanov
(74) *Attorney, Agent, or Firm* — Cozen O'Connor

(57) ABSTRACT

An optoelectronic semiconductor device is specified, comprising a multiplicity of radiation-emitting semiconductor chips (2), arranged in a matrix-like manner, wherein the semiconductor chips (2) are applied on a common carrier (1), at least one converter element (3) disposed downstream of at least one semiconductor chip (2) for converting electromagnetic radiation emitted by the semiconductor chip (2), at least one scattering element (4) situated downstream of each semiconductor chip (2) and serving for diffusely scattering electromagnetic radiation emitted by the semiconductor chip (2), wherein the scattering element (4) is in direct contact with the converter element (3).

13 Claims, 5 Drawing Sheets

(56) References Cited

U.S. PATENT DOCUMENTS

| | | | |
|---|---|---|---|
| 2006/0105485 A1* | 5/2006 | Basin et al. | 438/27 |
| 2006/0138938 A1 | 6/2006 | Tan et al. | |
| 2006/0152140 A1 | 7/2006 | Brandes | |
| 2006/0208269 A1* | 9/2006 | Kim et al. | 257/98 |
| 2006/0270081 A1 | 11/2006 | Chua et al. | |
| 2007/0103939 A1 | 5/2007 | Huang et al. | |
| 2008/0074032 A1* | 3/2008 | Yano et al. | 313/503 |
| 2008/0121911 A1* | 5/2008 | Andrews et al. | 257/98 |
| 2008/0179618 A1 | 7/2008 | Cheng | |
| 2008/0210965 A1 | 9/2008 | Hung | |
| 2008/0290351 A1 | 11/2008 | Ajiki et al. | |
| 2010/0012955 A1* | 1/2010 | Sorg et al. | 257/88 |

FOREIGN PATENT DOCUMENTS

| | | | |
|---|---|---|---|
| CN | 1910762 | | 2/2007 |
| CN | 201137827 | | 10/2008 |
| DE | 198 45 229 | | 3/2000 |
| DE | 10 2006 024 165 | | 11/2007 |
| EP | 1 566 848 | | 2/2005 |
| EP | 1 906 462 | | 4/2008 |
| EP | 2 101 213 | | 3/2009 |
| GB | 2 373 368 | | 9/2002 |
| JP | 10-269822 | | 10/1998 |
| JP | 2000-022222 | | 1/2000 |
| JP | 2003-191521 | | 7/2003 |
| JP | 2004-341446 | | 12/2004 |
| JP | 2006-086191 | | 3/2006 |
| JP | 2006-140362 | | 6/2006 |
| JP | 2006-162846 | | 6/2006 |
| JP | 2006-332682 | | 12/2006 |
| JP | 2007-067204 | | 3/2007 |
| JP | 2007-258228 | | 10/2007 |
| JP | 2008-112861 | | 5/2008 |
| JP | 2008-527708 | | 7/2008 |
| JP | 2008-294224 | | 12/2008 |
| TW | 200802994 | | 1/2008 |
| WO | WO 03/098707 | | 11/2003 |
| WO | WO 2008/007232 | | 1/2008 |
| WO | WO 2008/040315 | * | 4/2008 |
| WO | WO 2008/072196 | | 6/2008 |
| WO | WO 2008/091319 | | 7/2008 |

* cited by examiner

OPTOELECTRONIC SEMICONDUCTOR COMPONENT

RELATED APPLICATIONS

This is a U.S. national stage of application No. PCT/EP2009/067888, filed on Dec. 23, 2009.

This patent application claims the priority of German application no. 10 2009 005 907.5 filed Jan. 23, 2009, the disclosure content of which is hereby incorporated by reference.

BACKGROUND OF THE INVENTION

An optoelectronic semiconductor device is specified.

SUMMARY OF THE INVENTION

One object of the invention is to provide an optoelectronic semiconductor device which enables a uniform radiation emission distributed over the device and the perception of brightness differences for an external observer of the device is thus reduced.

One object to be achieved consists in specifying an optoelectronic semiconductor device which enables a uniform radiation emission distributed over the device and the perception of brightness differences for an external observer of the device is thus reduced.

In accordance with at least one embodiment of the semiconductor device, the device comprises a multiplicity of radiation-emitting semiconductor chips, arranged in particular in a matrix-like manner. The semiconductor chips are applied on a common carrier. In this context, "in a matrix-like manner" means that the multiplicity of radiation-emitting semiconductor chips are applied preferably in the form of rows and columns on the carrier. In this case, the semiconductor chips need not necessarily be applied in a regular grid on the carrier.

By way of example, interspaces are formed between the semiconductor chips arranged in a matrix-like manner. In other words, the semiconductor chips are then arranged in a manner spaced apart from one another. In a plan view of the device, the interspaces are delimited by the side areas of two semiconductor chips respectively adjacent to one another and that surface of the carrier which faces the semiconductor chips.

The radiation-emitting semiconductor chips can be luminescence diode chips, for example. The luminescence diode chips can be light-emitting or laser diode chips that emit radiation in the range from ultraviolet to infrared light. Preferably, luminescence diode chips emit light in the visible or ultraviolet range of the spectrum of the electromagnetic radiation. The common carrier can be a printed circuit board or a leadframe. The device is surface-mountable, for example. The carrier can be formed with a thermosetting plastic or thermoplastic material or else with a ceramic material, or consist of such a material. The radiation-emitting semiconductor chips arranged in a matrix-like manner are applied on the common carrier.

In accordance with at least one embodiment of the semiconductor device, at least one converter element for converting electromagnetic radiation emitted by the semiconductor chip is disposed downstream of at least one semiconductor chip. The at least one converter element is disposed downstream of the semiconductor chip along a radiation exit path of the semiconductor device. The radiation exit path is the path of the radiation from the emission by the semiconductor chip through to the coupling-out of the electromagnetic radiation from the device. The at least one converter element converts light having one wavelength into light having another wavelength. By way of example, the at least one converter element converts blue light primarily emitted by the at least one semiconductor chip partly into yellow light, which can be mixed together with the blue light to form white light. The at least one converter element therefore has the function of a light converter during the operation of the semiconductor device. Preferably, the at least one converter element is applied to a radiation exit area of the at least one semiconductor chip and in this case is in direct contact with the at least one semiconductor chip. By way of example, this can be achieved by adhesively bonding the converter element onto the semiconductor chip. It is also possible for the converter element to be applied to the radiation exit area of the semiconductor chip by means of a screen printing method. This advantageously enables near-chip color conversion of the electromagnetic radiation primarily emitted by the semiconductor chip. However, there is also the possibility of the at least one converter element being in contact with the semiconductor chip only indirectly. That can mean that a gap is formed between the converter element/semiconductor chip interface and so the converter element and the semiconductor chip do not touch one another. The gap can be filled with a gas, for example air.

The converter element can be formed with a silicone, an epoxide, a mixture of silicone and epoxide, or a transparent ceramic, into which particles of a conversion substance are introduced.

By way of example, precisely one converter element is assigned to each semiconductor chip. In this case, it is possible for a converter element to be uniquely assigned to each semiconductor chip.

In accordance with at least one embodiment of the device, the optoelectronic semiconductor device comprises at least one scattering element situated downstream of each semiconductor chip and serving for diffusely scattering electromagnetic radiation emitted by the semiconductor chip. The scattering element is preferably in direct contact with the at least one converter element. The scattering element comprises, for example, a matrix material into which radiation-scattering particles are additionally introduced. The electromagnetic radiation emitted by the semiconductor chip is then scattered at the radiation-scattering particles (also called diffuser particles). It is likewise possible for the scattering element to be embodied, for example, as a roughened plate composed of transparent material. There are at least two possibilities in the configuration of the scattering element. Firstly, it is possible for precisely one scattering element to be situated downstream of all the semiconductor chips. Secondly, a dedicated scattering element can be situated downstream of and thus uniquely assigned to each semiconductor chip. It was possible to show that the electromagnetic radiation emitted by the semiconductor chip becomes particularly uniform as a result of the scattering element, such that inhomogeneities are avoided and intensity spikes are smoothed in the emission characteristic of the device. Advantageously, therefore, for an external observer, a glare effect is avoided and a radiation exit area of the device thus advantageously appears more homogeneous and more uniform in its brightness.

In this context, "emission characteristic" relates to the light emission properties such as intensity and color depending on the deviation with respect to the optical axis of the semiconductor device.

The optical axis of the device runs, for example, perpendicularly to that surface of the carrier of the device which faces the semiconductor chips.

The radiation exit area of the device is, for example, the area enclosed by a border of all the scattering elements or the converter elements.

A further advantage of introducing such a scattering element is that externally incident extraneous light is diffusely reflected by the scattering element, such that the diffusely reflected extraneous light is not superimposed by the electromagnetic radiation generated by the device. This results in the advantage that such a scattering element, besides the effects already mentioned, additionally increases the color light contrast.

Furthermore, the scattering element and the converter element are preferably in direct contact with one another. That is to say that neither a gap nor an interspace nor an interruption is formed at the scattering element/converter element interface. This advantageously makes it possible that as much electromagnetic radiation as possible that is emitted by the converter element or transmitted by the converter element is collected by the scattering element and thus diffusely scattered. By way of example, this can be achieved by the scattering element being adhesively bonded onto the converter element or, by means of a screen printing process, the scattering element being applied to the converter element by blade coating.

In accordance with at least one embodiment, the optoelectronic semiconductor device comprises a multiplicity of radiation-emitting semiconductor chips arranged in a matrix-like manner, wherein the semiconductor chips are applied on a common carrier. Furthermore, the optoelectronic semiconductor device comprises at least one converter element which is disposed downstream of at least one semiconductor chip for converting electromagnetic radiation emitted by the semiconductor chip. Furthermore, each semiconductor chip is followed by a scattering element for diffusely scattering electromagnetic radiation emitted by the semiconductor chip, wherein the scattering element is in direct contact with the converter element. This can involve a single scattering element or a multiplicity of scattering elements.

In this case, the optoelectronic semiconductor device described here is based on the insight, inter alia, that, for an external observer of the radiation exit area of the device, the carrier of the device can be discerned through the interspaces and, as a result, brightness differences occur upon observation of the radiation exit area of the device if no scattering element is present.

For an external observer this results in an inhomogeneous emission image of brightly luminous regions, on which the semiconductor chips are situated, and of dark, non-luminous regions, which represent the interspaces between the semiconductor chips. In order, then, to avoid such an inhomogeneous emission image, the device described here makes use of the concept of disposing a scattering element downstream of each semiconductor chip, wherein the scattering element is in direct contact with the converter element. The problem of the device interspaces appearing dark for an external observer is then solved in that, in a plan view of the radiation exit area of the device, the interspaces appearing dark are superimposed by the electromagnetic radiation diffusely scattered by the scattering elements.

When the radiation exit area of the device is observed, the interspaces appearing dark are thus superimposed at least in places with the electromagnetic radiation diffusely scattered by the scattering elements from regions of the interspaces.

This gives an observer the impression of a uniformly radiation-emitting device in which differences in luminance over the radiation exit area are reduced. In this context, "luminance" is a measure of the brightness of the radiation exit area of the device and is defined by light intensity per area. As a result, the device appears more homogeneous in its brightness for an external observer from its radiation exit area.

Glare effects are advantageously avoided as a result of the at least one scattering element being applied to the semiconductor chips, since the scattering elements diffusely scatter the electromagnetic radiation emitted by the semiconductor chips, as a result of which inhomogeneities and intensity spikes are avoided in the emission characteristic of the device.

In accordance with at least one embodiment, the lateral distance between adjacent semiconductor chips is between 1 and 150 µm, preferably between 10 and 150 µm. That is to say that the distance between two side areas of two adjacent chips is between 10 and 150 µm. This enables an especially compact and space-saving semiconductor device. Furthermore, this affords the possibility of minimizing the space taken up by the interspaces.

In accordance with at least one embodiment of the optoelectronic semiconductor device, the at least one scattering element is formed with a matrix material into which radiation-scattering particles (also called diffuser particles) are introduced. The matrix material can be a silicone, an epoxide or a mixture of silicone and epoxide. The scattering element can likewise also be formed with a ceramic material. Radiation-scattering particles that diffusely scatter radiation incident on the matrix material are introduced into the matrix material. Preferably, the matrix material is a material which is transparent to the electromagnetic radiation generated by the semiconductor chip in order to ensure that radiation is coupled out from the device to the highest possible extent.

In accordance with at least one embodiment of the optoelectronic semiconductor device, at least one radiation-scattering particle consists at least of the materials silicon dioxide ($SiO_2$), $ZrO_2$, $TiO_2$ and/or $Al_xO_y$, or contains at least one of these materials. By way of example, the aluminum oxide can be $Al_2O_3$. The radiation-scattering particles are mixed with the matrix material before being introduced into the semiconductor device. Preferably, the radiation-scattering particles are distributed in the matrix material in such a way that the concentration of the radiation-scattering particles in the cured matrix material is uniform. Preferably, the matrix material cured to form a scattering element scatters electromagnetic radiation isotropically. The scattering of the emitted radiation at the particles likewise improves the color homogeneity and smoothes the electromagnetic radiation in its intensities. In this case, "color homogeneity" means the stability of the hue over the spatial emission through the radiation exit area of the scattering element.

In accordance with at least one embodiment of the optoelectronic semiconductor device, the concentration of the radiation-scattering particles in the matrix material is more than 1% by weight. Preferably, the concentration is more than 5% by weight. It has been possible to show that, starting from such a concentration of the radiation-scattering particles in the scattering elements, the electromagnetic radiation emitted by the semiconductor chip is scattered so diffusely by the scattering elements that the perception of the interspaces appearing dark at the radiation exit area is reduced for an external observer.

In accordance with at least one embodiment of the semiconductor device, the at least one scattering element is formed from a matrix material into which microstructures are introduced. That is to say that the microstructures are introduced into the matrix material in the form of, for example, coarse-grained microstructures (also called small grains). Preferably, the coarse-grained microstructures have a different refractive index with respect to the matrix material surrounding them, such that the electromagnetic radiation is diffusely scattered or optically refracted at the microstructures. The coarse-grained microstructures can be formed with a silicone, an epoxide or a mixture of silicone and epoxide.

In accordance with at least one embodiment of the semiconductor device, the at least one scattering element is a light-scattering film or a light-scattering plate. That is to say, along the radiation exit path of the semiconductor device, the light-scattering film or the plate directly follows the converter element and diffusely scatters the electromagnetic radiation emitted by the semiconductor chip.

By way of example, the light-scattering film or the plate is adhesively bonded onto the top side of the converter element, said top side facing away from the semiconductor chip. Preferably, the converter element and the light-scattering film or the plate are in direct contact with one another and neither a gap nor an interruption is formed at the converter element/film or converter element/plate interface. Preferably, a thickness of the film comprises 10 to 50 µm, particularly preferably 30 µm. Preferably, the plate has a thickness of 500 µm to 1 mm. The film or the plate is formed with a material transparent to electromagnetic radiation, such as silicone, into which radiation-scattering particles were introduced prior to curing to form the film or the plate. Preferably, the light-scattering film has a concentration of the radiation-scattering particles of more than 5% by weight.

Alternatively, the light-scattering plate can also be formed with a ceramic material.

In addition or as an alternative to the introduction of radiation-scattering particles into the matrix material, both the film and the plate can have structurings of their outer areas, for example roughenings. The film or the plate can be adhesively bonded after curing onto that surface of the converter element which faces away from the semiconductor chip. The viscous material can likewise be applied directly, and then cures.

In accordance with at least one embodiment, precisely one scattering element is disposed downstream of each semiconductor chip, wherein the scattering element laterally projects beyond the converter element assigned to the semiconductor chip. The scattering element is applied by means of adhesive bonding, screen printing or the like onto the top side of the converter element assigned to it, said top side facing away from the semiconductor chip. Preferably, the scattering element laterally projects beyond both the converter element and the semiconductor chip. The scattering elements project beyond the semiconductor chips at all exposed side areas preferably at least by 5 and at most by 75 µm. What is achieved by such a configuration of the scattering element is that the respective distances between the scattering elements applied to the semiconductor chips are reduced or minimized. Upon emission of electromagnetic radiation, the electromagnetic radiation emitted by the semiconductor chip is diffusely scattered.

Preferably, electromagnetic radiation is diffusely scattered by virtue of the light distribution in the scattering element also by regions of the scattering elements which, in a plan view of the light coupling-out area, cover the interspaces at least in places. At the radiation exit area, the interspaces appearing dark are thus superimposed, at least in places, with the electromagnetic radiation scattered from the scattering elements also over regions of the interspaces. For an external observer, upon observation of the radiation exit area of the device, this advantageously results in smaller differences in luminance between regions which emit electromagnetic radiation and the interspaces. The radiation exit area therefore appears more homogeneous and more uniform in its brightness, as a result of which the impression of a device that emits radiation uniformly over the entire radiation exit area arises for the observer.

In accordance with at least one embodiment, precisely one scattering element is disposed downstream of the semiconductor chips, and covers all the semiconductor chips, wherein the scattering element has a continuous radiation exit area. By way of example, the scattering element can be a film or a plate applied to all the top sides of the converter elements, said top sides facing away from the semiconductor chips. In this embodiment, the scattering element covers not only the semiconductor chips but likewise the interspaces between the semiconductor chips completely. Preferably, the scattering element is constituted such that it is self-supporting. That is to say that, after application, the scattering element requires no further fixing and stabilizing measures. Preferably, the scattering element then maintains its form in regions in which it covers the interspaces, such that neither fracture locations, unevennesses or the like are formed in the scattering element. The interspaces appearing dark are therefore preferably completely superimposed with the electromagnetic radiation diffusely scattered from the scattering element also over regions of the interspaces. Thus, the differences in luminance between regions which emit electromagnetic radiation and regions of interspaces are reduced further. For an external observer of the radiation exit area, the emission of the electromagnetic radiation thus appears to be even more uniform and distributed even more homogeneously over the entire radiation exit area. Furthermore, the glare effect for an external observer is advantageously reduced since the electromagnetic radiation emitted by the semiconductor chips is smoothed in its intensities by the scattering element. Moreover, what is furthermore achieved is that the hue is homogenized and stabilized over the entire radiation exit area. Such a scattering element is especially suitable for a device comprising a large number of semiconductor chips since the radiation exit area of the device then has a large area and, therefore, not only are the already mentioned advantageous luminous properties of the device advantageously manifested, but the scattering element can, for example, be applied in just a single method step.

Furthermore, a method for producing an optoelectronic device is specified. A device described here can be produced by means of the method. That is to say that all features disclosed in conjunction with the device are also disclosed for the method, and vice versa.

In accordance with at least one embodiment of the method, firstly a carrier element is provided. The carrier element can be a film, for example.

In a second step, at least one converter element is formed on the carrier element by means of a screen printing process. After a first stencil has been applied, by means of the screen printing process the material of the at least one converter element is applied to the carrier element, for example by blade coating. After application and possible curing of the material, the first stencil is removed from the carrier element. The material for the at least one converter element can be, for example, a layer comprising silicone or composed of a transparent ceramic into which converter particles are introduced.

In a third step, using a second stencil applied to the carrier element, by means of a second screen printing process, at least one scattering element is applied, as a second layer, to all exposed outer areas of the at least one converter element. The scattering element covers the converter element at all exposed side areas and the top side facing away from the carrier element. The material can be applied by blade coating, for example, and then cures.

After the detachment of the carrier element and the second stencil from the composite assembly consisting of the at least one converter element and second layer, the composite assembly is applied on the at least one radiation-emitting semiconductor chip.

BRIEF DESCRIPTION OF THE DRAWINGS

The device described here and also the method described here are explained in greater detail below on the basis of exemplary embodiments and with reference to the associated figures.

DETAILED DESCRIPTION OF THE DRAWINGS

In the exemplary embodiments and the figures, identical or identically acting constituent parts are in each case provided with the same reference symbols. The elements illustrated should not be regarded as true to scale; rather, individual elements may be illustrated with an exaggerated size in order to afford a better understanding.

Figure 1A:
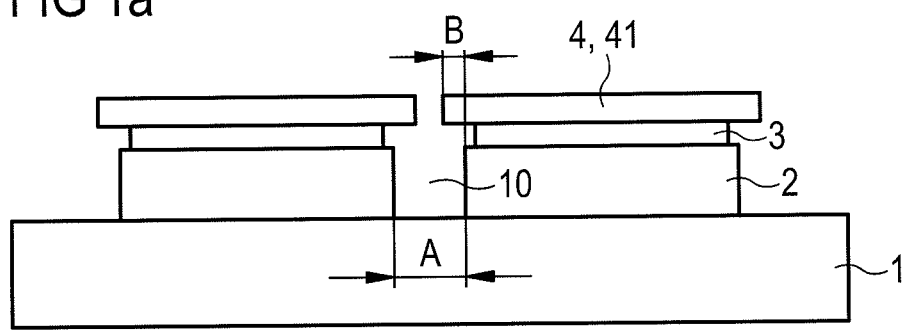
FIGS. 1a and 1b show, in schematic sectional illustrations, exemplary embodiments of an optoelectronic device described here.

FIG. 1a illustrates, on the basis of a schematic sectional illustration, an optoelectronic semiconductor device described here, comprising a carrier 1. The semiconductor chips 2 arranged in a matrix-like manner are applied on the common carrier 1.

The carrier 1 can be formed with a plastic, a ceramic or a metal. The carrier 1 is embodied as a printed circuit board or, if the carrier 1 is metallic, as a leadframe of the device.

The semiconductor chips 2 are conductively connected to the carrier 1. The converter elements 3 are applied on the semiconductor chips 2, said converter elements converting the radiation primarily emitted by the semiconductor chips 2 into radiation having a different wavelength. In the present example, the converter elements 3 are in each case an optical CLC layer (chip level conversion layer), which partly converts the blue light primarily emitted by the semiconductor chips 2 into yellow light. The converter elements 3 can each be a layer, formed with silicone or composed of transparent ceramic, into which converter particles are introduced.

Scattering elements 4 that diffusely scatter light, in the form of light-scattering plates 41, are respectively applied on the converter elements 3 and laterally project beyond the respective semiconductor chips 2 by the length B. In the present case, the light-scattering plates 41 project beyond the semiconductor chips 2 in each case by at most 75 μm. The light-scattering plates 41 have a thickness of 750 μm in the present case. The material of the light-scattering plates 41 is a silicone that was mixed with radiation-scattering particles composed of aluminum oxide prior to curing to form the plates 4. The concentration of the aluminum oxide particles in the light-scattering plates 41 is 5% by weight. With such a concentration, the most distinct effects can be obtained with regard to minimizing the differences in luminance along a radiation exit area of the device and avoiding the glare effects for an external observer. The radiation exit area of the device is formed and defined by the top sides of the light-scattering plates 41, said top sides facing away from the semiconductor chips 2. Furthermore, it is possible to achieve a homogeneous color impression over the entire radiation exit area, such that the device appears in accordance with a predeterminable color impression for an external observer. The distance between the individual side areas from semiconductor chip to semiconductor chip is defined by A and lies within the range of between 10 and 150 μm. In the present example, the distance A is 100 μm.

Figure 1B:
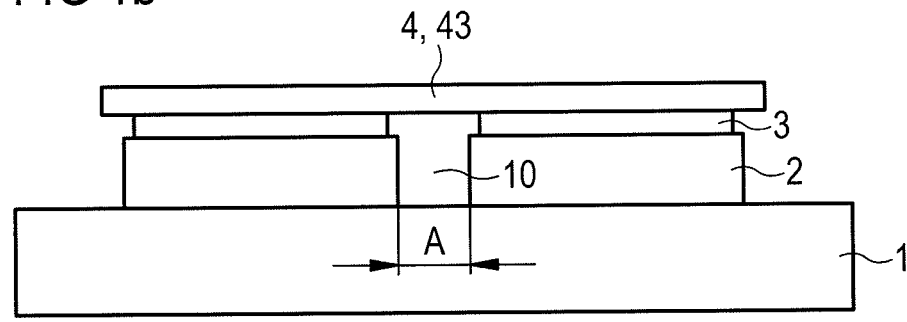

FIG. 1b shows an optoelectronic semiconductor device wherein the scattering element 4 is formed by a continuous layer. In the present example, a layer in the form of a continuous light-scattering film 43 is involved. The light-scattering film 43 has a thickness of 10 to 50 μm, in the present case 30 μm. The light-scattering film 43 is once again formed with a silicone which is transparent to electromagnetic radiation and into which the radiation-scattering particles composed of aluminum oxide in a concentration of 5% by weight were introduced prior to curing. In a plan view of the device, the light-scattering film 43 completely covers all the semiconductor chips and interspaces 10 between the semiconductor chips. What is thus advantageously achieved is that the interspaces 10 appearing dark are superimposed with the radiation diffusely scattered in the manner proceeding from the light-scattering film 43 also over regions of the interspaces 10. By virtue of the fact that the light-scattering film 43 is embodied in a manner free of gaps and continuously as one layer, the interspaces 10 are superimposed or covered by the electromagnetic radiation scattered by the light-scattering film 43 even more completely and more uniformly than is the case in the exemplary embodiment described in FIG. 1a. This advantageously prevents an external observer from being able to discern and perceiving the interspaces 10 appearing dark between the semiconductor chips. The further desired effects, as already mentioned in the explanations concerning the exemplary embodiment in FIG. 1a, are advantageously achieved. Such a scattering element 4 is especially suitable for a device comprising a large number of semiconductor chips 2 since the radiation exit area then has a large area and, therefore, not only are the already mentioned advantageous luminous properties of the device advantageously manifested, but the light-scattering film 43 can be applied in just a single method step. This configuration of the scattering element 4 not only saves costs but also saves time in terms of its production.

Figure 2A:
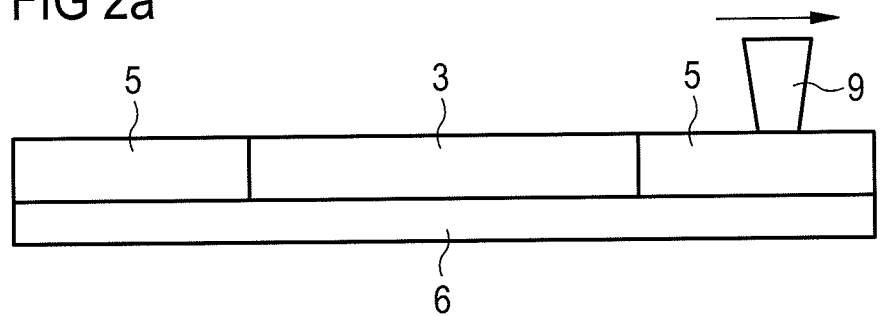
FIGS. 2a, 2b, 2c and 2d show individual manufacturing steps for the production of at least one exemplary embodiment of a device described here.

A method described here for producing a device in accordance with FIG. 1a, for example, is explained in greater detail in conjunction with FIGS. 2a, 2b, 2c and 2d on the basis of schematic sectional illustrations. FIG. 2a shows a film, serving as a carrier element 6 for the production process. A first stencil 5 is applied on the carrier element 6. By means of an imprint means, which is a doctor blade 9 in this example, the material of the converter element 3 is introduced into the openings of the stencil 5. The material of the converter element 3 can be a layer comprising silicone or composed of a ceramic material into which converter particles are introduced. After the application of the converter element 3 by means of screen printing onto the stencil 5 and a possibly curing material the stencil 5 is removed from the carrier element 6 and from the converter element 3. The converter element 3 forms a first layer on the carrier element 6.

In a second step, a second layer 7 is applied to the carrier element 6 and, by means of a second screen printing process using the doctor blade 9, a scattering element 4 is applied as a second layer 7 to the second stencil 8 by blade coating.

Figure 2B:
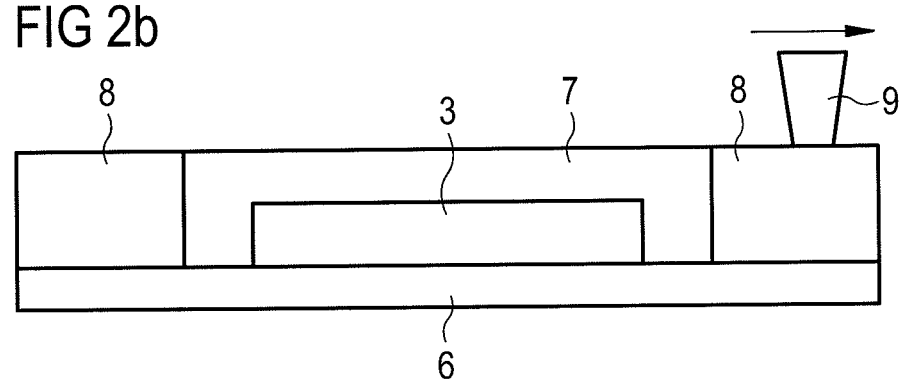
Figure 2C:
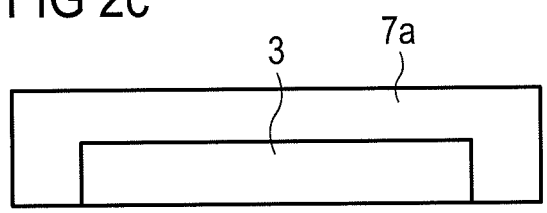
Figure 2D:
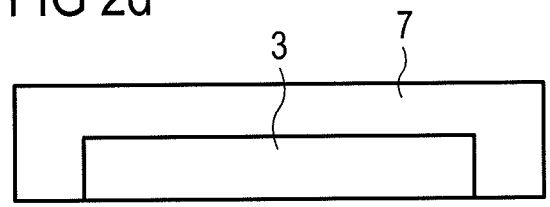

The second layer 7 covers the converter element 3 at all exposed outer areas and is in direct contact with the converter element 3, see FIG. 2b. After the application of the second layer 7 to the converter element 3, the second stencil 8 is removed both from the carrier element 6 and from the composite assembly consisting of the converter element 3 and the second layer 7. By way of example, this is a converter layer which converts the light emitted by the converter element 3 into colored light.

If a second converter layer 7a is involved, the process can be repeated and, in a third or further step, the scattering element is applied to the second converter layer 7a.

As an alternative to the screen printing method described here, a viscous medium can be dripped onto the stencils 5 and/or 8. By means of a spin-coating process, the material is subsequently distributed on the surface of the carrier element 6 and can then cure. The composite assembly is subsequently applied to a respective one of the semiconductor chips 2. Application can take place for example by means of plate transfer and/or adhesive bonding.

It is likewise possible, by means of suitable stencils, to produce a multiplicity of converter elements 3 arranged in a matrix-like manner by means of an individual production process, for example by means of a screen printing process, using a correspondingly constituted stencil 5. With the aid of a second screen printing process, for example, a second plate-like layer 7 is formed, which covers all exposed outer areas of the converter elements 3 and is continuous. After curing and removal of both the carrier element 6 and the second stencil 8, this results in a plate-like composite assembly consisting of the converter elements 3 and the continuous second layer 7 surrounding the converter elements 3. Afterward, the plate-like composite assembly can be applied directly to the semiconductor chips 2 arranged in a matrix-like manner. In a plan view of the device, the composite assembly then covers all the semiconductor chips 2 and the interspaces 10 of the device. Advantageously, such a process is especially cost-effective.

Figure 3A:
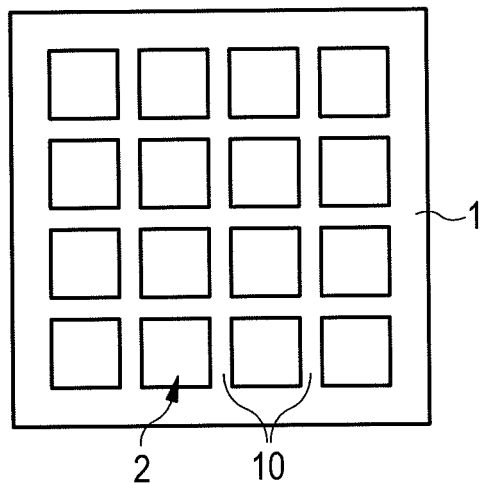
FIGS. 3a, 3b and 3c show the device after individual manufacturing steps in schematic plan views for the production of at least one exemplary embodiment of a device described here.

FIG. 3a shows, in a schematic plan view, a carrier 1, on which the semiconductor chips 2 are situated and applied. The semiconductor chips 2 are arranged in a matrix-like manner in the form of rows and columns.

Figure 3B:
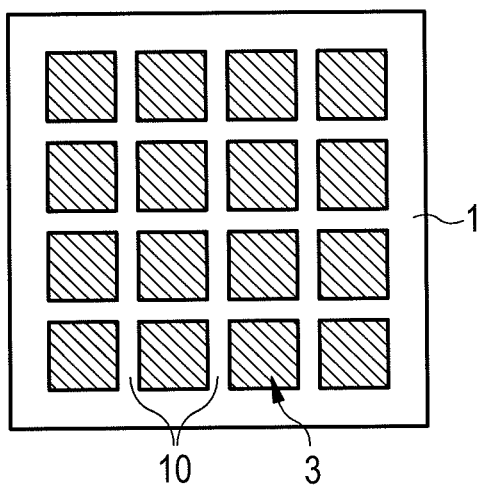

FIG. 3b shows the semiconductor chips arranged in a matrix-like manner in accordance with FIG. 3a, in the case of which the converter elements 3 in the form of individual plates have additionally been applied on the semiconductor chips 2. The application of the converter elements 3 on a respective semiconductor chip assigned to the respective converter element can take place by means of for example plate transfer (also called pick & place) and/or adhesive bonding.

Figure 3C:
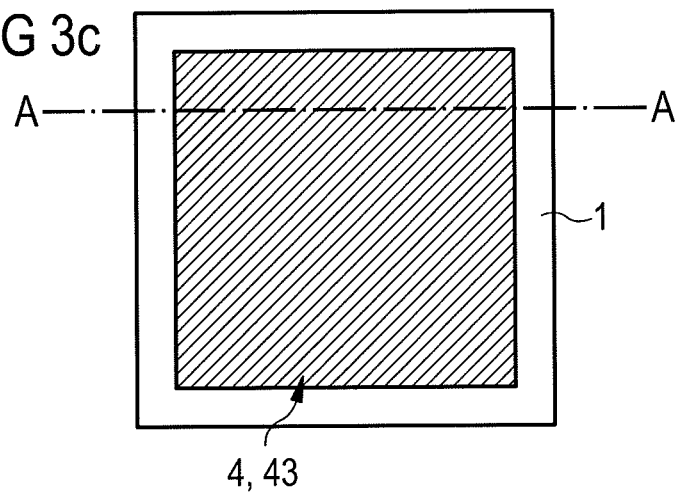

FIG. 3c shows the finished optoelectronic semiconductor device, wherein the scattering element 4 in the form of a continuous layer, for example the continuous light-scattering film 43, is applied to the semiconductor chips 2 arranged in a matrix-like manner. In the plan view, the light-scattering film 43 covers both the surfaces of the semiconductor chips 2 and all the interspaces 10.

If the finished optoelectronic semiconductor device in accordance with FIG. 3c is viewed along a line A-A in a side view, this results in an optoelectronic semiconductor device in accordance with FIG. 1b.

Figure 4A:
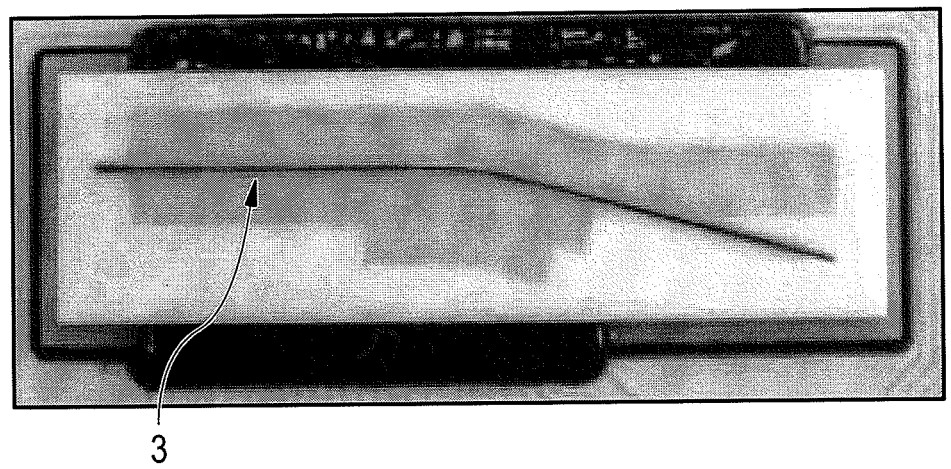
FIGS. 4a, 4b, 4c, 4d and 4e show schematic plan views of an optoelectronic device in accordance with an exemplary embodiment described here.

FIG. 4a shows a schematic plan view of an optoelectronic semiconductor device of this type in the switched-off operating state. The figure reveals the semiconductor chips 3 arranged in a matrix-like manner and the locations which appear somewhat brighter and which represent the converter elements 3 applied on the semiconductor chips 2.

Figure 4B:
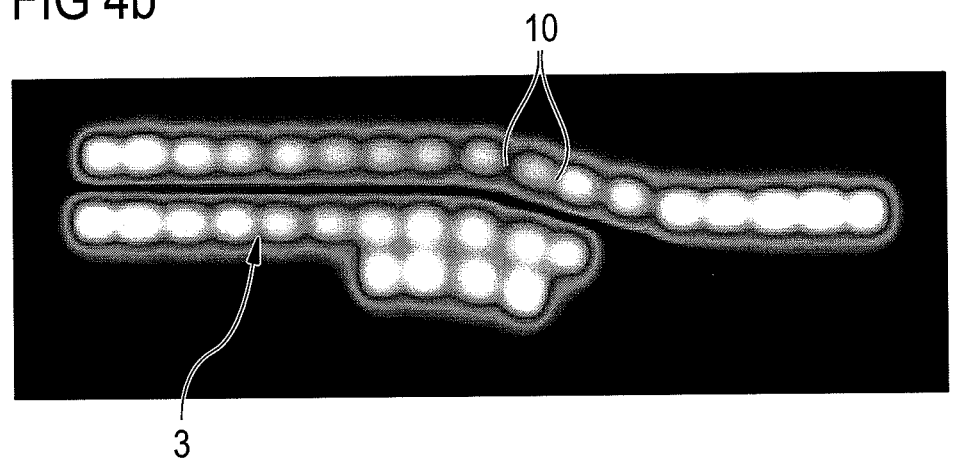

FIG. 4b shows the optoelectronic semiconductor device in the switched-on operating state without applied scattering elements. The brightly luminous points show the emission areas of the semiconductor chips 2 that are discernible to an external observer. Interspaces 10 that appear darker are respectively situated between the semiconductor chips 2. It can be discerned that the differences in luminance from semiconductor chip to interspace stand out greatly.

Figure 4C:
Figure 4D:
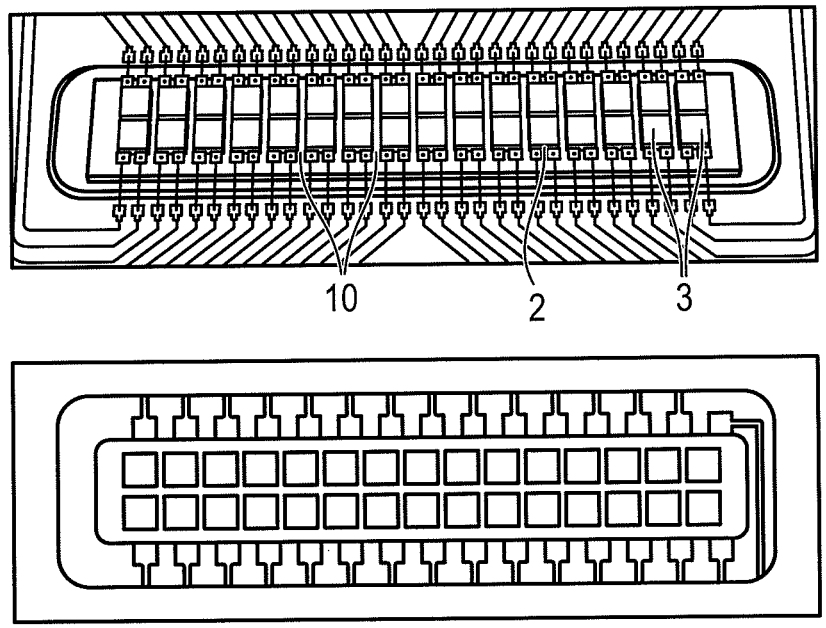

FIG. 4c shows the optoelectronic semiconductor device in the switched-on operating state, wherein a scattering element 4 in the form of the continuous film 43 has been applied over the semiconductor chips 2. The scattering element 4 homogenizes the location-dependent differences in luminance shown here. The more brightly luminous points that can still be discerned in part show the emission areas of the semiconductor chips 2 that are discernible to an external observer. The interspaces 10 are no longer discernible after the scattering element 4 has been applied, such that the differences in luminance from semiconductor chip to interspace can be avoided by means of the scattering element 4. FIGS. 4d and 4f show plan views of such an optoelectronic device.

FIG. 4d shows a device without scattering elements 4, wherein the semiconductor chips 2 arranged in a matrix-like manner and the converter elements 3 applied on the semiconductor chips 2 can be discerned. The grid-like, dark locations are the interspaces 10 of the device.

Figure 4E:
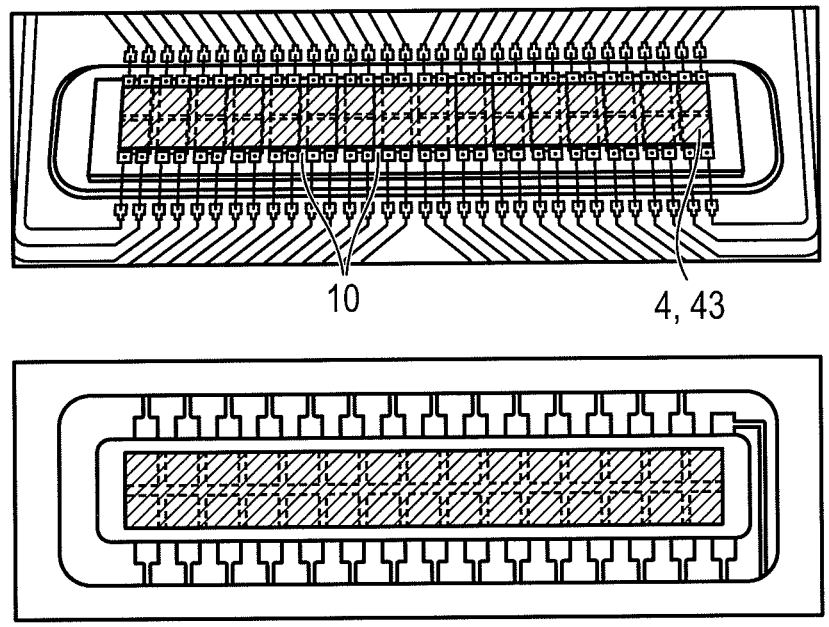

FIG. 4e shows, in a plan view, a finished optoelectronic device, wherein the scattering element 4 forms a continuous film that covers not only all the semiconductor chips but also all the interspaces 10 without gaps. It is evident that the interspaces 10 are distinctly more difficult to discern.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. An optoelectronic semiconductor device comprising:
a multiplicity of radiation-emitting semiconductor chips, arranged in particular in a matrix-like manner, wherein the semiconductor chips are applied on a common carrier and wherein the semiconductor chips each have a radiation exit area facing away from the carrier element;
at multiplicity of converter elements disposed downstream of the semiconductor chip for converting electromagnetic radiation emitted by the semiconductor chips; and
precisely scattering element situated downstream of the semiconductor chip and serving for diffusely scattering electromagnetic radiation emitted by the semiconductor chips,
wherein the scattering element covers all the semiconductor chips and has a continuous radiation exit area,
wherein the scattering element is in direct contact with the converter elements and neither a gap nor an interspace is formed at the interface between the converter elements and the scattering element,
and wherein the converter elements and the scattering element form a composite assembly, which is applied to the corresponding semiconductor chips by means of adhesive bonding, so that each converter element is assigned uniquely to one semiconductor chip,
wherein each converter element covers solely the radiation exit area of the corresponding semiconductor chip, so that the converter element does not cover side areas of the corresponding semiconductor chip, wherein the side areas extend transversely to the radiation exit area.

2. The optoelectronic semiconductor device according to claim 1, wherein the lateral distance between adjacent semiconductor chips is between 10 and 150 µm.

3. The optoelectronic semiconductor device according to claim 1, wherein the scattering element is formed with a matrix material into which radiation-scattering particles are introduced.

4. The optoelectronic semiconductor device according to claim 3, wherein at least one radiation-scattering particle comprises at least one of the following materials or contains one of the following materials: $SiO_2$, $ZrO_2$, $TiO_2$, or $Al_xO_y$.

5. The optoelectronic semiconductor device according to claim 3, wherein the concentration of the radiation-scattering particles in the matrix material is greater than 1% by weight.

6. The optoelectronic semiconductor device according to claim 1, wherein the scattering element is formed with a matrix material into which microstructures are introduced.

7. The optoelectronic semiconductor device according to claim 1, wherein the scattering element is a light-scattering film or a light-scattering plate.

8. The optoelectronic semiconductor device according to claim 1, wherein the precisely one scattering element covers all exposed outer areas of the converter element, which are not covered by the semiconductor chip.

9. The optoelectronic semiconductor device according to claim 1, wherein the scattering element is self-supporting.

10. The optoelectronic semiconductor device according to claim 1,
wherein the converter elements laterally do not project beyond the corresponding semiconductor chips,
wherein the distance between adjacent semiconductor chips is between 10 pm and 150 µm, and
wherein the gap between adjacent semiconductor chips is not filled with a solid or liquid material, mechanically supporting the scattering element above the gap.

11. An optoelectronic semiconductor device comprising:
a multiplicity of radiation-emitting semiconductor chips, arranged in particular in a matrix-like manner, wherein the semiconductor chips are applied on a common carrier and wherein the semiconductor chips each have a radiation exit area facing away from the carrier element;
a multiplicity of converter elements disposed downstream of the semiconductor chip for converting electromagnetic radiation emitted by the semiconductor chip; and
precisely one scattering element situated downstream of each semiconductor chip and serving for diffusely scattering electromagnetic radiation emitted by the semiconductor chips,
wherein the scattering element covers all the semiconductor chips and has a continuous radiation exit area,
wherein the scattering element is in direct contact with the converter elements and neither a gap nor an interspace is formed at the interface between the converter element and the scattering element,
wherein the at scattering element is a light-scattering film or a light-scattering plate, and
wherein the light-scattering film has a thickness of 10 to 50 µm and light-scattering plate has a thickness of 500 µm to 1 mm,
wherein the converter elements and the scattering elements form a composite assembly, which is applied to the corresponding semiconductor chips by adhesive bonding, so that each converter element is assigned uniquely to one semiconductor chip,
wherein each converter element covers solely the radiation exit area of the corresponding semiconductor chip, so that the converter element does not cover side areas of the corresponding semiconductor chip.

12. A method for producing an optoelectronic semiconductor device, comprising the steps of:
providing a carrier element;
forming a multiplicity of converter element with a first screen printing process on the converter element;
forming precisely one scattering element onto the exposed outer areas of the converter elements with a second screen printing process and forming a composite assembly comprising the converter element and the at least one scattering element, wherein the scattering element covers all the converter elements and has a continuous radiation exit area, wherein neither a gap nor an interspace is formed at the interface between the converter elements and the scattering element and;
detaching the carrier element from the composite assembly; and
subsequently applying the composite assembly comprising the converter elements and the scattering element to radiation-emitting semiconductor chips.

13. The method according to claim 12, wherein an optoelectronic semiconductor device according to claim 1 is produced.

* * * * *

UNITED STATES PATENT AND TRADEMARK OFFICE
CERTIFICATE OF CORRECTION

PATENT NO. : 8,916,886 B2
APPLICATION NO. : 13/146124
DATED : December 23, 2014
INVENTOR(S) : Moritz Engl et al.

It is certified that error appears in the above-identified patent and that said Letters Patent is hereby corrected as shown below:

In the Claims

Column 10, claim 1, line 42, should read:
-- 1. An optoelectronic semiconductor device comprising: a multiplicity of radiation-emitting semiconductor chips, arranged in particular in a matrix-like manner, wherein the semiconductor chips are applied on a common carrier and wherein the semiconductor chips each have a radiation exit area facing away from the carrier element; a multiplicity of converter elements disposed downstream of the semiconductor chip for converting electromagnetic radiation emitted by the semiconductor chips; and precisely one scattering element situated downstream of the semiconductor chips and serving for diffusely scattering electromagnetic radiation emitted by the semiconductor chips, wherein the scattering element covers all the semiconductor chips and has a continuous radiation exit area, wherein the scattering element is in direct contact with the converter elements and neither a gap nor an interspace is formed at the interface between the converter elements and the scattering element, and wherein the converter elements and the scattering element form a composite assembly, which is applied to the corresponding semiconductor chips by means of adhesive bonding, so that each converter element is assigned uniquely to one semiconductor chip, wherein each converter element covers solely the radiation exit area of the corresponding semiconductor chip, so that the converter element does not cover side areas of the corresponding semiconductor chip, wherein the side areas extend transversely to the radiation exit area. --

Column 11, claim 10, line 30, should read:
-- 10. The optoelectronic semiconductor device according to claim 1, wherein the converter elements laterally do not project beyond the corresponding semiconductor chips, wherein the distance between adjacent semiconductor chips is between 10 μm and 150 μm, and wherein the gap between adjacent semiconductor chips is not filled with a solid or liquid material, mechanically supporting the scattering element above the gap. --

Signed and Sealed this
Ninth Day of June, 2015

Michelle K. Lee
*Director of the United States Patent and Trademark Office*

CERTIFICATE OF CORRECTION (continued)
U.S. Pat. No. 8,916,886 B2

Column 11, claim 11, line 39, should read:
-- 11. An optoelectronic semiconductor device comprising: a multiplicity of radiation-emitting semiconductor chips, arranged in particular in a matrix-like manner, wherein the semiconductor chips are applied on a common carrier and wherein the semiconductor chips each have a radiation exit area facing away from the carrier element; a multiplicity of converter elements disposed downstream of the semiconductor chip for converting electromagnetic radiation emitted by the semiconductor chips; and precisely one scattering element situated downstream of each semiconductor chip and serving for diffusely scattering electromagnetic radiation emitted by the semiconductor chips, wherein the scattering element covers all the semiconductor chips and has a continuous radiation exit area, wherein the scattering element is in direct contact with the converter elements and neither a gap nor an interspace is formed at the interface between the converter element and the scattering element, wherein the scattering element is a light-scattering film or a light-scattering plate, and wherein the light-scattering film has a thickness of 10 to 50 μm and the light-scattering plate has a thickness of 500 μm to 1 mm, wherein the converter elements and the scattering elements element form a composite assembly, which is applied to the corresponding semiconductor chips by adhesive bonding, so that each converter element is assigned uniquely to one semiconductor chip, wherein each converter element covers solely the radiation exit area of the corresponding semiconductor chip, so that the convertor element does not cover side areas of the corresponding semiconductor chip. --

Column 12, claim 12, line 25, should read:
-- 12. A method for producing an optoelectronic semiconductor device, comprising the steps of: providing a carrier element; forming a multiplicity of converter elements with a first screen printing process on the carrier element; forming precisely one scattering element onto the exposed outer areas of the converter elements with a second screen printing process and forming a composite assembly comprising the converter element and the scattering element, wherein the scattering element covers all the converter elements and has a continuous radiation exit area, wherein neither a gap nor an interspace is formed at the interface between the converter elements and the scattering element and; detaching the carrier element from the composite assembly; and subsequently applying the composite assembly comprising the converter elements and the scattering element to radiation-emitting semiconductor chips. --

UNITED STATES PATENT AND TRADEMARK OFFICE
CERTIFICATE OF CORRECTION

PATENT NO. : 8,916,886 B2  
APPLICATION NO. : 13/146124  
DATED : December 23, 2014  
INVENTOR(S) : Engl et al.

Page 1 of 1

It is certified that error appears in the above-identified patent and that said Letters Patent is hereby corrected as shown below:

In the claims

Col. 11 and 12 line 39-26 claim 11 should read

11. An optoelectronic semiconductor device comprising: a multiplicity of radiation-emitting semiconductor chips, arranged in particular in a matrix-like manner, wherein the semiconductor chips are applied on a common carrier and wherein the semiconductor chips each have a radiation exit area facing away from the carrier element; a multiplicity of converter elements disposed downstream of the semiconductor chip for converting electromagnetic radiation emitted by the semiconductor chips; and precisely one scattering element situated downstream of each semiconductor chip and serving for diffusely scattering electromagnetic radiation emitted by the semiconductor chips, wherein the scattering element covers all the semiconductor chips and has a continuous radiation exit area, wherein the scattering element is in direct contact with the converter elements and neither a gap nor an interspace is formed at the interface between the converter element and the scattering element, wherein the scattering element is a light-scattering film or a light-scattering plate, and wherein the light-scattering film has a thickness of 10 to 50 μm and the light-scattering plate has a thickness of 500 μm to 1 mm, wherein the converter elements and the scattering element form a composite assembly, which is applied to the corresponding semiconductor chips by adhesive bonding, so that each converter element is assigned uniquely to one semiconductor chip, wherein each converter element covers solely the radiation exit area of the corresponding semiconductor chip, so that the converter element does not cover side areas of the corresponding semiconductor chip.

Signed and Sealed this  
Twenty-sixth Day of January, 2016

Michelle K. Lee  
*Director of the United States Patent and Trademark Office*